(12) United States Patent
De Munck et al.

(10) Patent No.: US 8,530,264 B2
(45) Date of Patent: Sep. 10, 2013

(54) METHODS FOR MANUFACTURING ARRAYS FOR CMOS IMAGERS

(75) Inventors: Koen De Munck, Leuven (BE); Kiki Minoglou, Leuven (GR); Joeri De Vos, Neerwinden (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/195,664

(22) Filed: Aug. 1, 2011

(65) Prior Publication Data
US 2012/0028401 A1    Feb. 2, 2012

Related U.S. Application Data

(60) Provisional application No. 61/369,846, filed on Aug. 2, 2010.

(51) Int. Cl.
*H01L 21/00* (2006.01)
(52) U.S. Cl.
USPC ............. 438/73; 257/233; 257/292; 257/444; 257/E31.11; 438/48; 438/57; 438/66; 438/696; 438/756
(58) Field of Classification Search
USPC ............. 257/233, 292, 444, E32.11; 438/48, 438/57, 66, 73, 696, 756
See application file for complete search history.

(56) References Cited

U.S. PATENT DOCUMENTS

| | | | | |
|---|---|---|---|---|
| 5,479,049 | A * | 12/1995 | Aoki et al. | 257/642 |
| 2002/0089004 | A1* | 7/2002 | Rhodes | 257/290 |
| 2002/0117690 | A1* | 8/2002 | Rhodes | 257/215 |
| 2005/0042793 | A1* | 2/2005 | Mouli et al. | 438/57 |
| 2010/0314707 | A1* | 12/2010 | Yedinak et al. | 257/475 |
| 2012/0080765 | A1* | 4/2012 | Ku et al. | 257/432 |

OTHER PUBLICATIONS

De Munck, Koen et al., "High Performance Hybrid and Monolithic Backside Thinned CMOS Imagers Realized Using a New Integration Process", IEEE International Electron Devices Meeting, San Francisco, US, Dec. 2006, pp. 139-142.
Minoglou, Kyriaki et al., "Reduction of Electrical Crosstalk in Hybrid Backside Illuminated CMOS Imagers Using Deep Trench Isolation", IITC Conference, San Francisco, Jun. 2008, pp. 129-131.

* cited by examiner

*Primary Examiner* — Asok K Sarkar
(74) *Attorney, Agent, or Firm* — McDonnell Boehnen Hulbert & Berghoff LLP

(57) ABSTRACT

Methods of fabricating complementary metal-oxide-semiconductor (CMOS) imagers for backside illumination are disclosed. In one embodiment, the method may include forming at a front side of a substrate a plurality of high aspect ratio trenches having a predetermined trench depth, and forming at the front side of the substrate a plurality of photodiodes, where each photodiode is adjacent at least one trench. The method may further include forming an oxide layer on inner walls of each trench, removing the oxide layer, filling each trench with a highly doped material, and thinning the substrate from a back side opposite the front side to a predetermined final substrate thickness. In some embodiments, the substrate may have a predetermined doping profile, such as a graded doping profile, that provides a built-in electric field suitable to guide the flow of photogenerated minority carriers towards the front side.

20 Claims, 11 Drawing Sheets

METHODS FOR MANUFACTURING ARRAYS FOR CMOS IMAGERS

CROSS-REFERENCE TO RELATED APPLICATION

This application is a non-provisional of U.S. Provisional Patent Application Ser. No. 61/369,846 filed Aug. 2, 2010, the contents of which are hereby incorporated in their entirety.

BACKGROUND

Disclosed are methods of fabricating a photodetector array or pixel array for manufacturing complementary metal-oxide-semiconductor (CMOS) imagers, and to methods of fabricating CMOS imagers for backside illumination.

Backside illuminated CMOS imagers are known to have an excellent quantum efficiency that can compete with backside illuminated charge-coupled devices (CCDs), as for example demonstrated by K. De Munck et al., in "High performance hybrid and monolithic backside thinned CMOS imagers realized using a new integration process", *IEEE International Electron Devices Meeting, San Francisco, US*. December 2006, p 139-142. This excellent quantum efficiency was achieved by providing an epitaxial layer with a graded doping profile (where the graded doping profile provided a built-in electric field that guides the flow of photogenerated electrons (minority carriers) towards the depletion region at the front side), and performing backside Boron implantation and subsequent laser annealing for good backside passivation. However, it was noticed that the cross-talk was large in these backside illuminated CMOS imagers or sensors. About 88% overall signal leakage was observed.

Two approaches of fabricating thinned backside illuminated CMOS imagers exist: a monolithic approach and a hybrid approach. In a monolithic approach, a photodetector array or pixel array and the corresponding readout integrated circuit (ROIC) are produced in a same substrate, and both the pixel array and the ROIC are thinned. In a hybrid approach, the photodetector array is produced separately and hybridly integrated on the ROIC, such that only the photodetector array needs to be thinned. Each pixel of the array is connected to the ROIC by a metal bump, such as an indium bump.

To reduce the crosstalk between pixels (photodetectors) caused by the diffusion of photogenerated carriers between the pixels of backside illuminated imagers, a structure comprising deep trenches filled with highly doped polysilicon between the photodetectors has been proposed (K. Minoglou et al, "Reduction of electrical crosstalk in hybrid backside illuminated CMOS imagers using deep trench isolation", IITC Conf. San Francisco, June 2008, pp. 139-142). However, it was observed that the presence of the trenches negatively affects the quantum efficiency of the imagers. This is illustrated in FIG. 3, showing the measured quantum efficiency for a device without trenches (solid line) and for a device with trenches (dashed line). This difference in quantum efficiency is much larger than would be expected based on the lower fill factor due to the presence of trenches (leading to about 10% loss in quantum efficiency).

SUMMARY

Disclosed are alternative methods for fabricating CMOS imagers. Some embodiments are for backside illumination, wherein the imagers have very low electrical crosstalk (e.g., close to zero crosstalk) between neighboring pixels as well as very good quantum efficiency (e.g., close to 100% internal quantum efficiency) in a wavelength range of interest (e.g., in a wavelength range between 400 nm and 900 nm).

Particular aspects are set out in the accompanying independent and dependent claims. Features from the dependent claims may be combined with features of the independent claims as appropriate and not merely as explicitly set out in the claims. Any features may be disclaimed from any of the aspects.

In one aspect, a method of fabricating a photodetector array or a pixel array for a CMOS imager is disclosed. The method comprises forming in a front side of a substrate a plurality of high aspect ratio trenches having a predetermined trench depth. The method further comprises forming a plurality of photodiodes at the front side of the substrate, where each photodiode is adjacent at least one trench. The method further comprises forming an oxide layer on inner walls of each trench in the plurality of trenches, removing the oxide layer, filling each trench in the plurality of trenches with a highly doped material, and thinning the substrate from a back side opposite the front side to a predetermined thickness.

In some embodiments the oxidation step and the subsequent removal of the oxide layer from the walls of the plurality of trenches substantially removes defects, residues and impurities from the sidewalls of the trenches, leading to a reduction of charge carrier recombination at the trench sidewalls.

The cleaning of the sidewalls by removal of the oxide, can remove or substantially reduce any diffusion barrier (such as for example a native oxide) from the trench sidewalls, thus allowing a good out-diffusion of dopants from the highly doped polysilicon filling the trenches into the photosensitive layer. This can thereby create a built-in electric field further reducing charge carrier recombination at the trench sidewalls.

In some embodiments, the substrate may be a substrate with a predetermined doping profile, such as a graded doping profile providing a built-in electric field that guides the flow of photogenerated minority carriers towards the front side. This can for example be obtained by epitaxial growth of a silicon layer with the predetermined doping profile on a sacrificial substrate (e.g., a substrate that is at least partially removed in a later stage of the process).

In some embodiments, the high aspect ratio trenches may have a depth at least ten times their width.

In some embodiments, the predetermined trench depth is at least as large as the predetermined final substrate thickness, such that in a finished device the plurality of high aspect ratio trenches extends through the thinned substrate. However, the present disclosure is not limited thereto and the predetermined trench depth can be smaller than the predetermined final substrate thickness.

A method according to the present disclosure can advantageously be used for fabricating CMOS imagers for backside illumination.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure as claimed. The disclosure, both as to organization and method of operation, together with features and advantages thereof, may best be understood by reference to the following detailed description when read in conjunction with the accompanying drawings.

Figure 1:
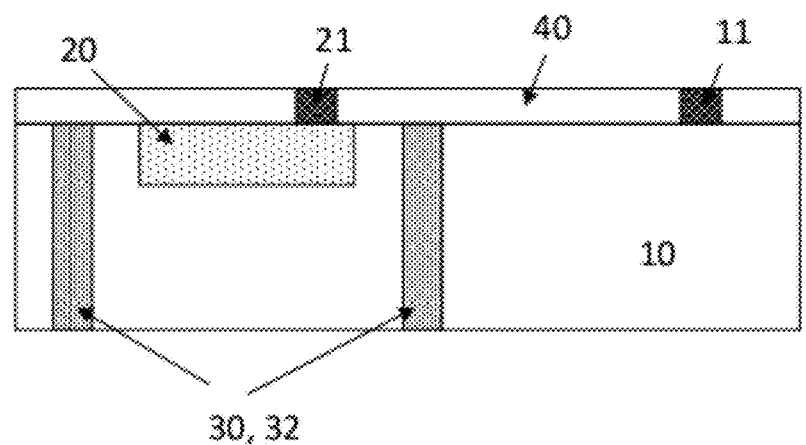
FIG. 1 schematically shows a cross section of a CMOS imager, showing a single pixel with trenches surrounding the pixel.

In the drawings, the same reference signs typically refer to the same or analogous elements, unless context dictates otherwise.

DETAILED DESCRIPTION

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the context of the present disclosure, the front side of a substrate or of an imager is the side of the substrate or imager where the photodiodes are provided. The back side or rear side of a substrate or imager is the side opposite to the front side.

In one aspect, a method of fabricating a photodetector array or a pixel array for a CMOS imager is disclosed. The method comprises forming in a front side of a substrate a plurality of high aspect ratio trenches having a predetermined trench depth. The method further comprises forming a plurality of photodiodes at the front side of the substrate, where each photodiode is adjacent at least one trench. The method further comprises forming an oxide layer on inner walls of each trench in the plurality of trenches, removing the oxide layer, filling each trench in the plurality of trenches with a highly doped material, and thinning the substrate from a back side opposite the front side to a predetermined thickness.

The disclosed method can advantageously be used for fabricating CMOS imagers for backside illumination.

In some embodiments, the substrate may have a graded doping profile providing a built-in electric field guiding the flow of photogenerated minority carriers towards the front side. Therefore, in some embodiments, the substrate may comprise a sacrificial substrate on which an epitaxial layer is grown having a graded doping profile. Thinning the substrate from the back side can comprise completely removing the sacrificial substrate or it can comprise partially removing the sacrificial substrate.

The predetermined final substrate thickness of a CMOS imager fabricated according to an embodiment of the disclosed method can, for example, be in the range between 5 micrometer and 50 micrometer, for example between 10 micrometer and 30 micrometer. However, the disclosed method is not limited thereto and the predetermined final substrate thickness can also be outside these ranges.

In some embodiments, the predetermined trench depth is at least as large as the predetermined final substrate thickness, such that in a finished device the plurality of high aspect ratio trenches completely extends through the thinned substrate. However, the disclosed method is not limited thereto and the predetermined trench depth can be smaller than the predetermined final substrate thickness.

Although the disclosed method is further described for embodiments wherein the substrate is a p-type silicon substrate, wherein photodiodes are formed by providing an n-type region (e.g., an n-well), and wherein the highly doped polysilicon is $p^+$ type silicon, the disclosed method is not limited thereto. For example, the substrate can be an n-type substrate wherein photodiodes are formed by providing a p-type region (e.g., a p-well) and wherein the highly doped polysilicon is $n^+$ type silicon.

FIG. 1 schematically shows a cross section of a CMOS imager, illustrating a single photodiode or pixel with trenches surrounding the photodiode. In the example shown, a photodiode is formed between an n-type well 20 and a p-type substrate 10. The p-type substrate 10 may have a graded doping concentration providing a built-in electric field guiding the flow of photo-generated electrons towards the front side. The substrate doping concentration can, for example, have a profile with a continuous slope resulting in a continuous electric field. Alternatively, the substrate doping concentration can, for example, have a "staircase" profile, meaning that the doping concentration decreases step-wise from the back side towards the front side. However, the disclosed method is not limited thereto and other suitable doping profiles providing a built-in electric field guiding the flow of photo-generated electrons towards the front side can be used.

High aspect ratio trenches 30 (e.g., 1 micrometer wide and 30 to 50 micrometers deep) filled with highly doped ($p^+$) polysilicon 32 are provided. The doping level of the $p^+$ polysilicon 32 can, for example, be on the order of $10^{20}$ cm$^{-3}$ to $10^{21}$ cm$^{-3}$, thus providing a lateral drift field between pixels after diffusion into the substrate. Such a lateral drift field counteracts diffusion of photogenerated charge carriers between pixels and thus limits electrical crosstalk between pixels. At the front side of the imager, a first electrical contact 11 to the p-type substrate 10 and a second electrical contact 21 to the n-well 20 are provided, as well as a dielectric layer 40.

The cross section shown in FIG. 1 illustrates an example of a structure that can advantageously be fabricated using an embodiment of the disclosed method. However, the disclosed method can also be used for fabricating other structures comprising trenches.

FIG. 2 illustrates process steps of an embodiment of the disclosed method, as can be used for fabricating the structure shown in FIG. 1. The trenches 30 may be provided at the beginning of the process flow, at the front side 1 of a p-type substrate 10, as shown in FIG. 2A. They can be formed by a Deep-Reactive Ion Etching (DRIE) step, using, for example, a photoresist and tetraethoxysilane (TEOS) as masks for the etching step. The trenches 30 may be, for example, about 1 micrometer wide and up to 50 micrometer deep. However, the disclosed method is not limited thereto and larger or smaller trenches can be formed.

Figure 2A:
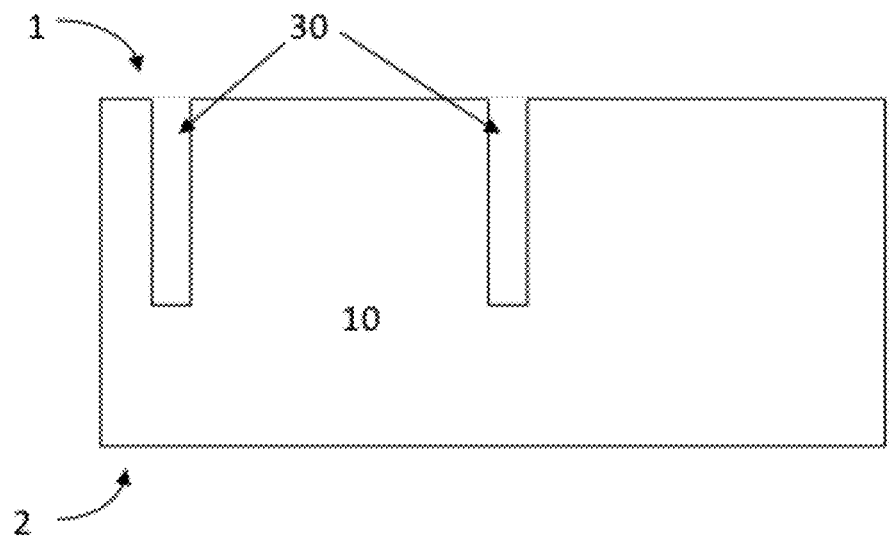
FIGS. 2A-F schematically illustrate process steps of a method in accordance with an embodiment.
Figure 2B:
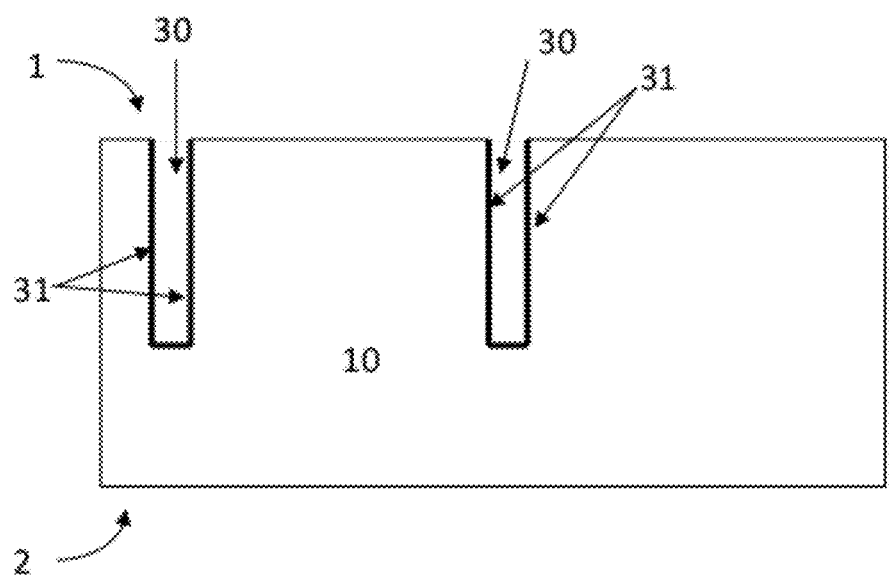

In some embodiments of the method, after etching the high aspect ratio trenches, an oxidation step is performed, thereby forming an oxide layer 31 at least on the sidewalls of the trenches, as shown in FIG. 2B. The oxidation can, for example, comprise in-situ steam generated (ISSG) oxidation, at, for example, a temperature in the range between 850° C. and 1100° C. Alternatively, the oxidation can comprise wet oxidation in a $H_2/O_2$ ambient at, for example, a temperature in the range between 650° C. and 1050° C. Other methods that may be used for performing the oxidation step are dry oxidation in an $O_2$ ambient or Rapid Thermal oxidation, or any other suitable method known by a person skilled in the art. The thickness of the oxide layer 31 may be in the range between 3 nm and 50 nm, or in the range between 10 nm and 30 nm. However, the disclosed method is not limited thereto and other oxide thicknesses can be used.

Figure 2C:
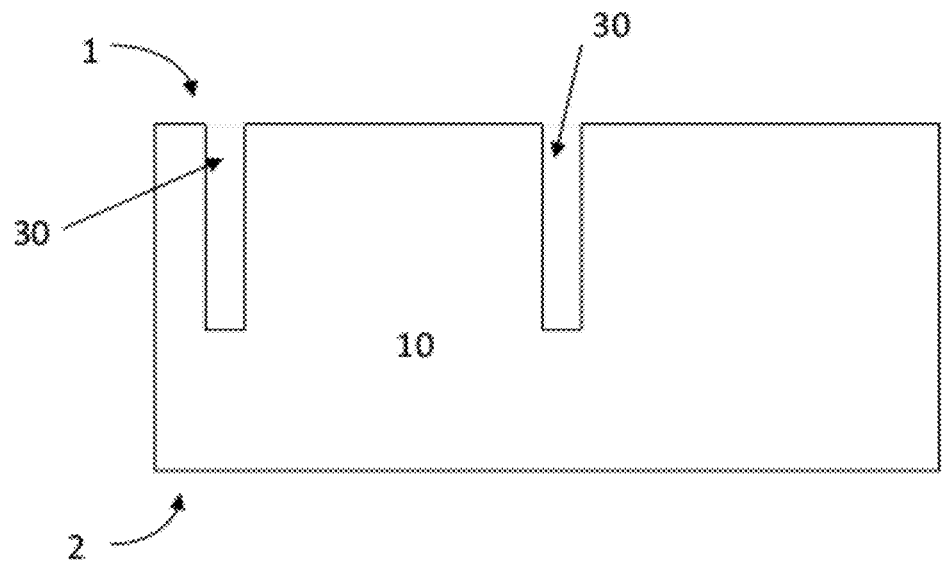
Figure 2D:
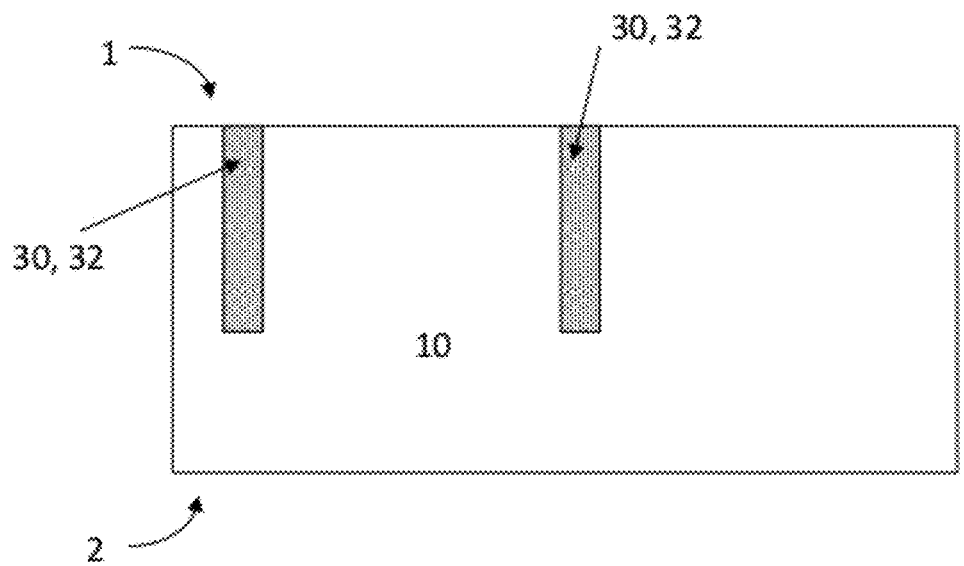

In a next step, the oxide layer 31 is removed at least from the sidewalls of the trenches 30, as shown in FIG. 2C. In some embodiments, the oxide layer 31 may be removed by wet etching. After removing the oxide layer, the trenches are filled with heavily doped ($p^+$) polysilicon 32, followed by chemical mechanical polishing (CMP) of the excess polysilicon at the silicon surface. A cross section of the resulting structure is shown in FIG. 2D.

Figure 4A:
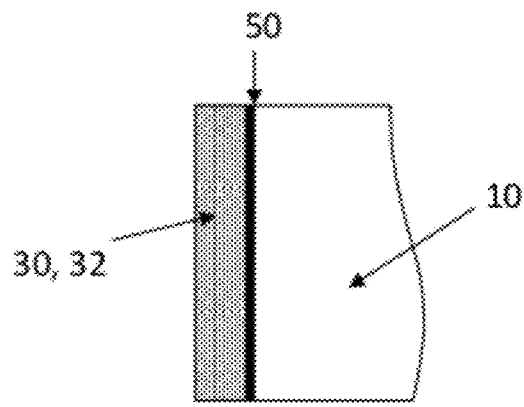
FIGS. 4A-B shows a schematic cross section of a p+ polysilicon filled trench with a thin barrier layer (FIG. 4A) and the simulated effect of the barrier layer thickness on the dopant distribution profile in the silicon substrate (FIG. 4B).
Figure 4B:
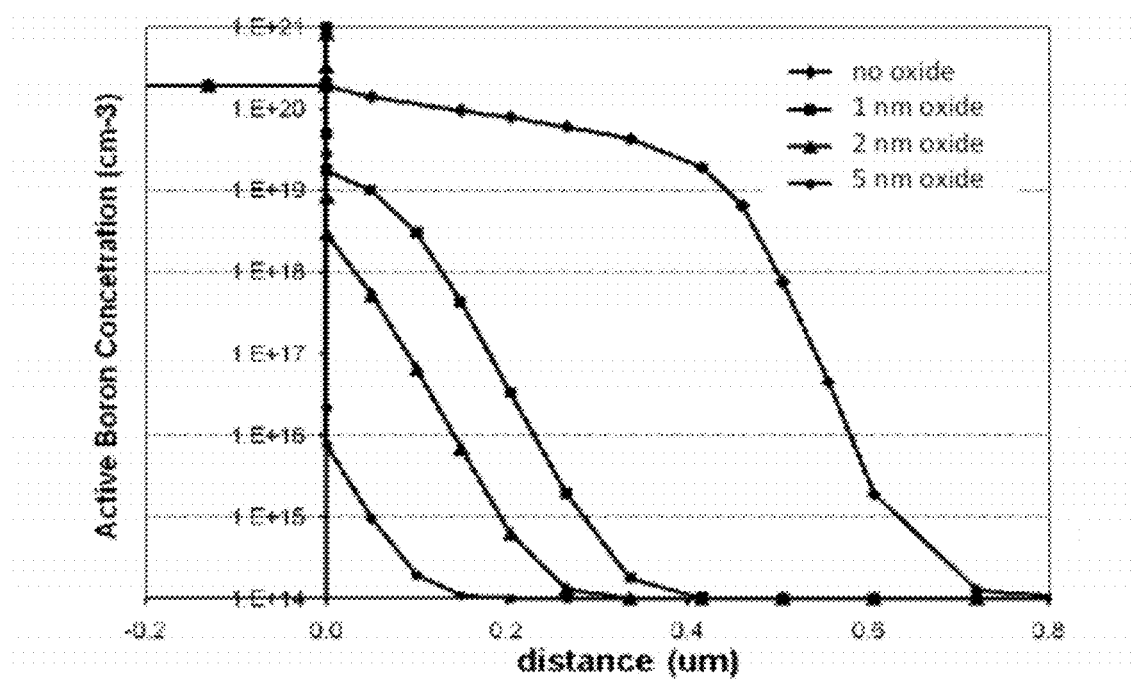

In some embodiments, after removing the oxide layer, optionally a very thin oxide layer (e.g., with a thickness 1 nm to 2 nm) can be grown on the sidewalls of the trenches before filling the trenches with heavily doped polysilicon. Such a very thin controlled oxide layer can act as a barrier layer and limit or avoid excessive out-diffusion of dopants from the heavily doped polysilicon filling the trenches into the substrate, while allowing sufficient diffusion (as illustrated in FIG. 4B) to passivate the sidewall surface states. Excessive out-diffusion could reduce the fill factor of the imager because the dopants can work as defects.

Figure 2E:
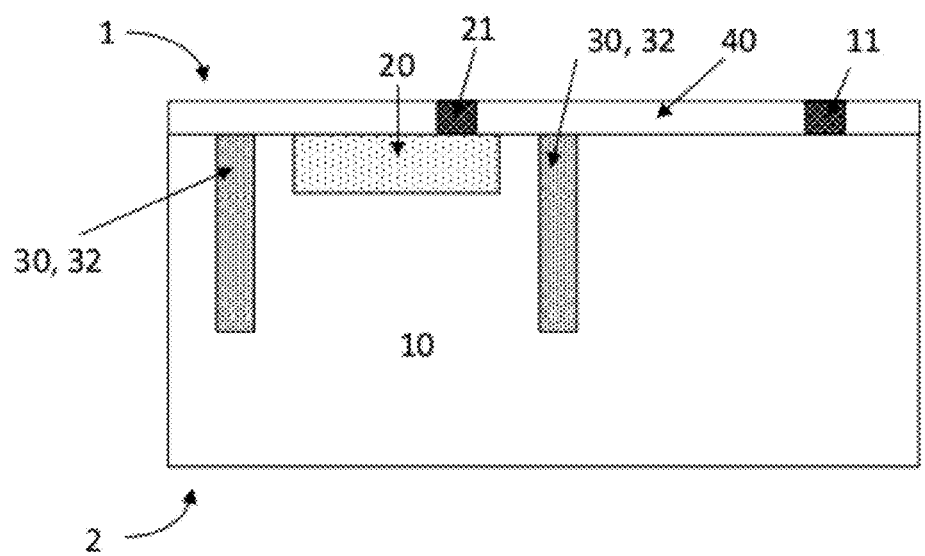
Figure 2F:
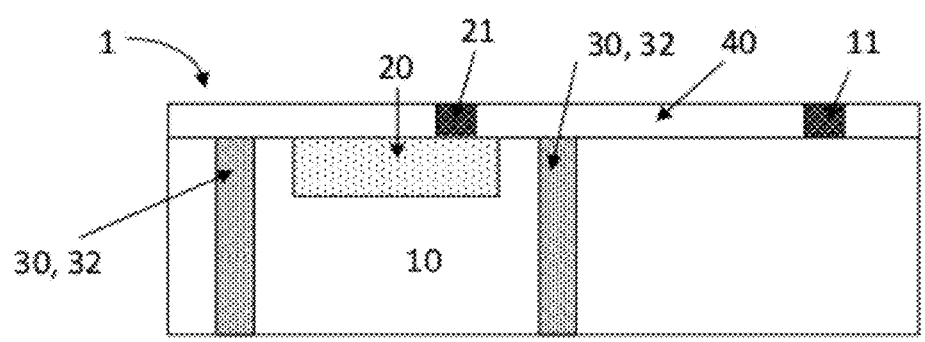

After trench filling, photodiodes (and optionally other devices) are formed at the front side 1. This may involve several process steps, such as active region definition, etching, implantations, silicidation of contact areas, metallization, passivation, etc. FIG. 2E shows a cross section after photodiode formation, illustrating an n-type well 20 forming the photodiode p-n junction with the p-type substrate 10, a first electrical contact 11 to the p-type substrate 10, a second electrical contact 21 to the n-well 20, and a dielectric layer 40.

Next a backside thinning step is performed as well as a backside surface treatment, in case of a hybrid imager followed by integration with the ROIC. The backside thinning step comprises thinning the substrate 10 from the back side 2 to a predetermined final substrate thickness. In the example shown in FIG. 2F the plurality of trenches 30 extends through the thinned substrate. However, the present disclosure is not limited thereto and the trench depth can be smaller than the final substrate thickness.

It is an advantage of some embodiments of the disclosed method that trenched devices with good quantum efficiency can be made, while maintaining the zero cross-talk feature of prior art trenched devices.

A number of experiments were performed in which photodiodes were processed on silicon wafers according to an embodiment of the disclosed method. Test diodes suitable for dark current measurements and front side illuminated measurements were fabricated. In addition, test diode arrays comprising about 1200 pixels connected in parallel were fabricated to evaluate the influence of trenches on the device performance.

In order to better understand the measured values and to evaluate their significance, a number of basic quantum efficiency simulations were made of representative structures.

Figure 3:
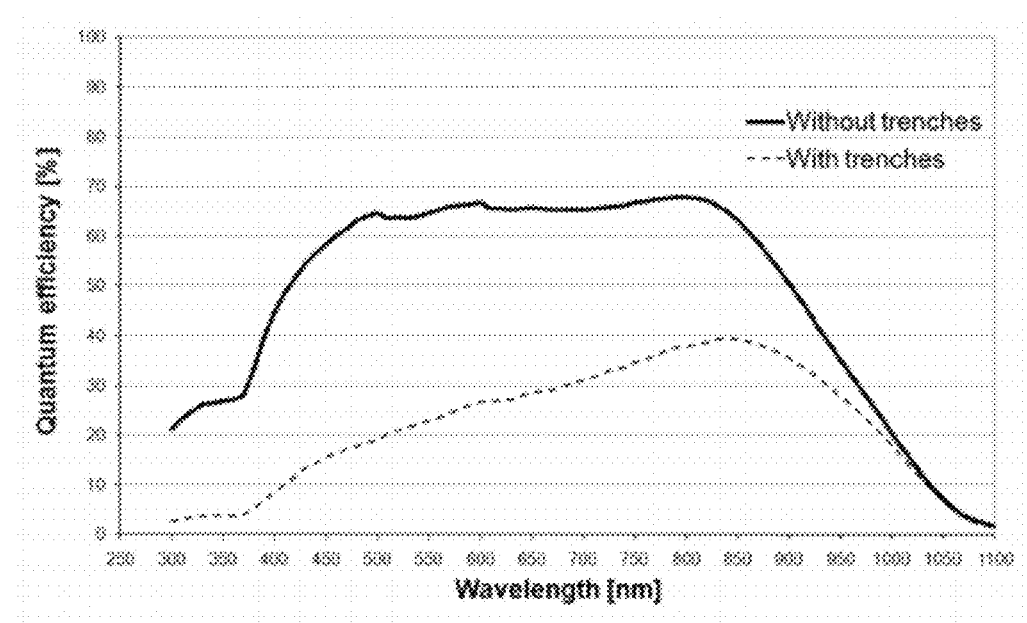
FIG. 3 shows the measured quantum efficiency of a 1000× 1000 CMOS imager without trenches and a 1000×1000 CMOS imager with trenches.
Figure 5:
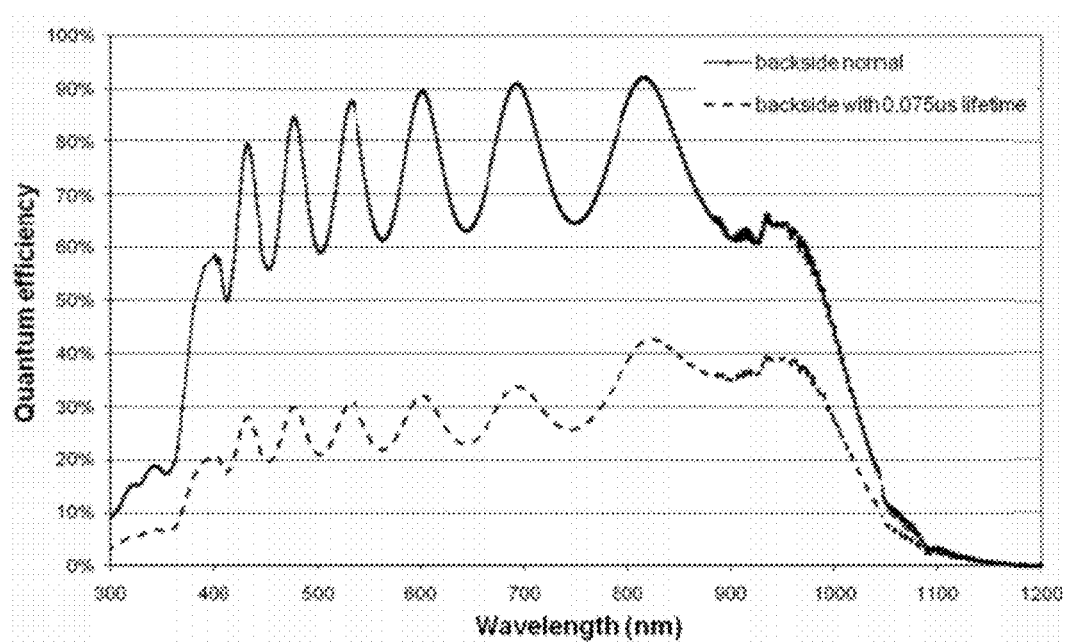
FIG. 5 shows the results of quantum efficiency simulations for thick backside illuminated CMOS imagers wherein the pixels are separated by trenches of different quality.

FIG. 5 shows the expected (simulated) quantum efficiency for 30 micrometer thick backside illuminated imagers in the presence of trenches in between the pixels. The simulated quantum efficiency is shown both for a perfect trench behavior (i.e., without minority carrier recombination at the trench sidewalls) (full line, 'backside normal'), and for a problematic trench behavior (i.e., with substantial minority carrier recombination at the trench sidewalls) (dashed line, 'backside with 0.075 microseconds lifetime). It is assumed that the problematic trench behavior as observed in prior art imagers is related to trench sidewall defects. These defects are simulated by reducing the diffusion length (decreased lifetime) in the substrate. The trend shown by the simulations (FIG. 5) is the same as observed for the measurement data (as shown in FIG. 3) of the prior art trenched imagers. In the simulations, the dielectric parameters were selected to simulate the backend dielectrics and thus do not represent an optimized anti-reflective coating, hence the interference fringes in the simulated curves (FIG. 5).

Figure 6:
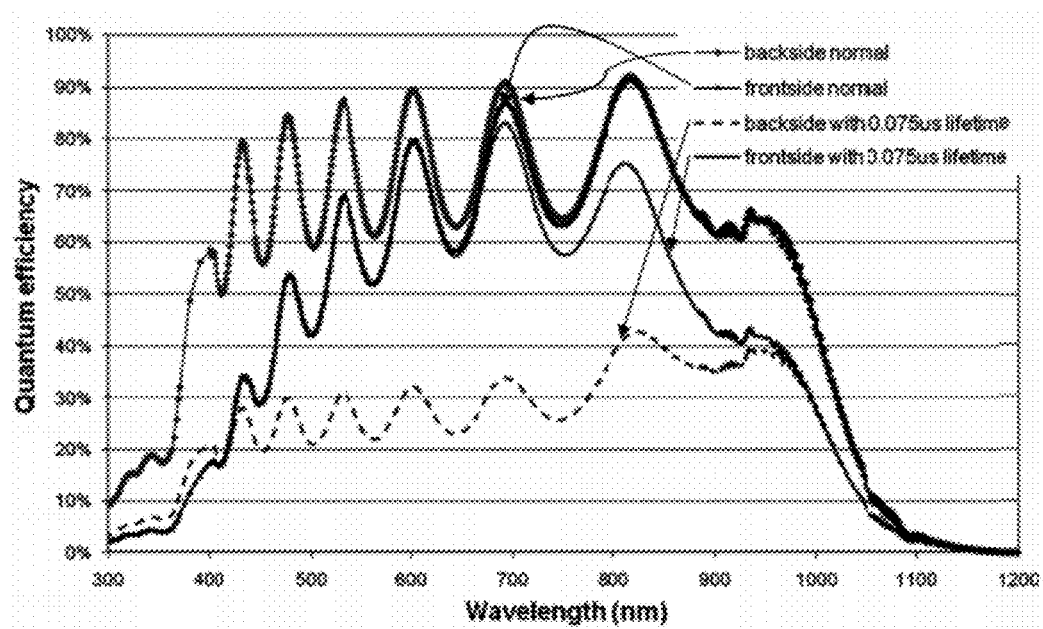
FIG. 6 shows the results of quantum efficiency simulations for thick frontside and backside illuminated imagers wherein the pixels are separated by trenches of different quality.

Next, quantum efficiency simulations were performed for front side illumination, assuming the same device parameters as for the backside simulations, and increasing the surface dead zone. The results of these simulations for front side illumination are shown in FIG. 6, together with the results for back side illumination. Clearly the difference between the two curves for front side illumination (one curve for trenches with perfect quality ('normal') and one curve for trenches with problematic quality ('0.075 μs lifetime')) is substantially smaller than the difference between the corresponding curves for the case of back side illumination. The difference in the lower wavelength region between the 'normal' (i.e. without minority carrier recombination at the trench sidewalls) front side illumination curve and the normal back side illumination curve is due to the surface dead zone which has increased.

Figure 9:
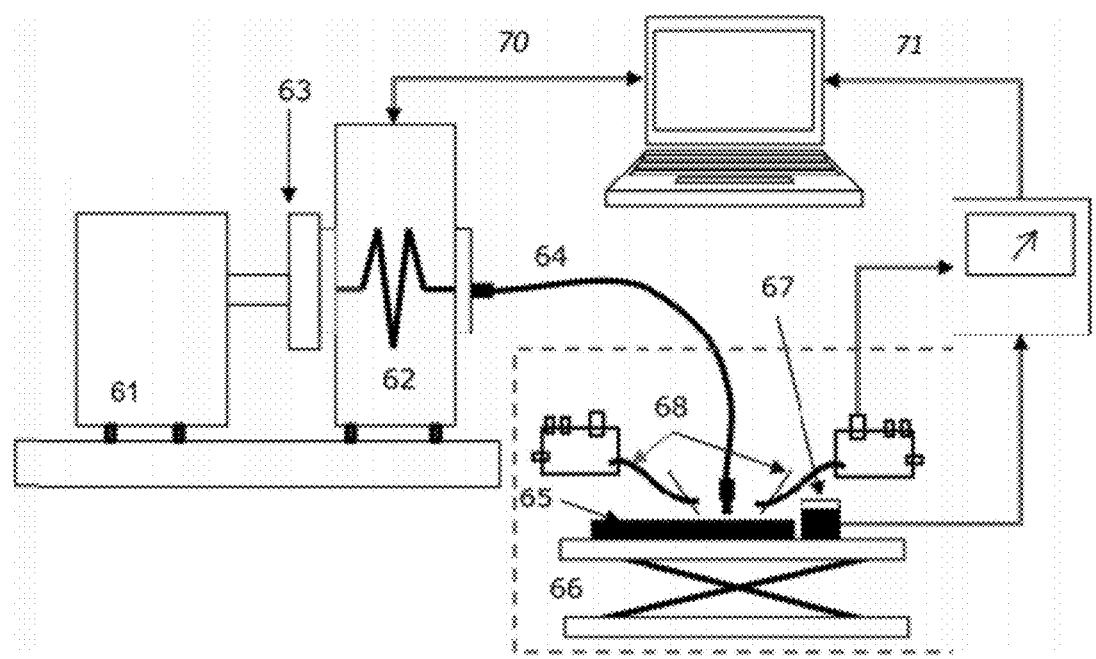
FIG. 9 illustrates a measurement setup used for performing quantum efficiency measurements of photodiodes.

Using a measurement setup similar to that schematically shown in FIG. 9, on-wafer measurements were performed and analyzed. The measurement setup comprises an illuminator 61 with a Xe arc lamp, a ⅛ monochromator 62 with motorized filter wheel 63, an optical fiber 64 directing the light from the monochromator to a test sample 65. The test sample is mounted on a moving stage 66, allowing adjusting the optical plane of the test sample or a calibrated reference photodiode 67 with respect to the optical fiber 64. Accurate positioning of the probe needles on the contacts of the sample is possible by using micrometer controlled probe heads 68. The system comprising the illuminator and the monochromator is optimized so that the illuminator output is focused and matched to the monochromator and provides light from 200 nm to 1000 nm with a resolution of 5 nm. The illuminator coupling to the monochromator is fixed by mounting both devices on a common base plate. This mounting kit includes a light shield to enclose the beam path. The system comprising the optical fiber and the moving stage is fixed inside a probe station with a metal black cover (dashed line in FIG. 9), providing light shielding from the environment. Fully automated software procedures allow fast wavelength scan (70) and accurate multiple point graph acquisition (71).

A rough estimation of the quantum efficiency was obtained by calculating the front side fill factor from the design (for the different types of test diodes) and roughly calibrating the contributions of the guard ring region (the guard ring not being connected) and the partially transparent silicidized regions within the pixels to the simulations. In other words, these quantum efficiencies are based upon reasonable, yet rough estimations.

Figure 7:
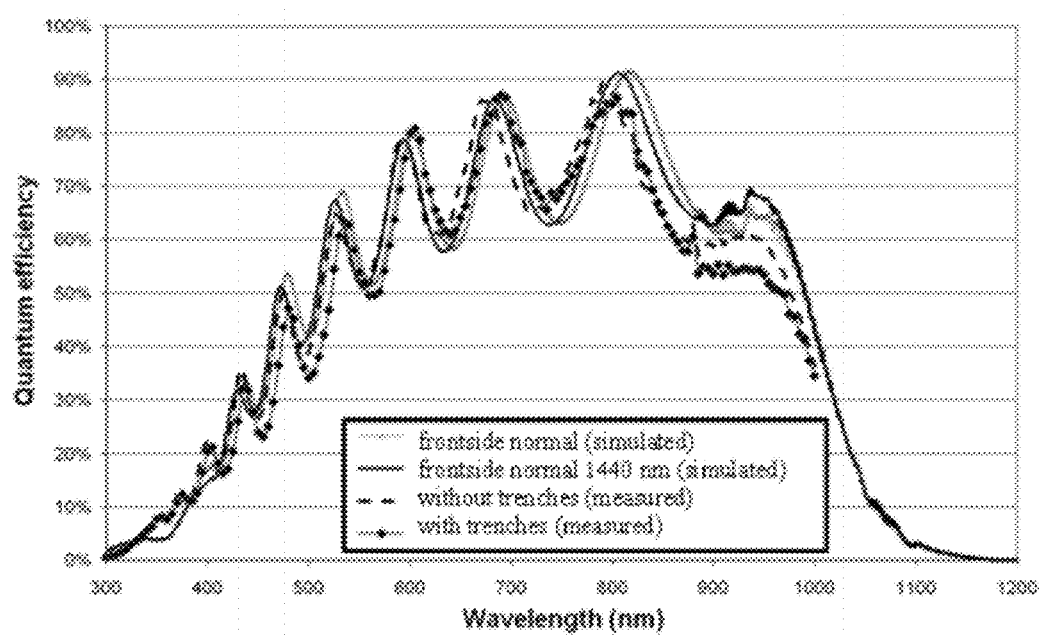
FIG. 7 shows measured and simulated quantum efficiency curves as a function of wavelength for non-trenched test diodes and for trenched test diodes fabricated according to a method of the present disclosure.

FIG. 7 shows the results of quantum efficiency measurements under front side illumination for test diodes without trenches and for test diodes with trenches fabricated according to an embodiment of the disclosed method. In addition, FIG. 7 shows matching simulations. Although the test diodes are on the same wafer next to each other, there is a slight difference between the two measured data sets in the position of the peaks of the interference fringes. This difference can be explained by a variation in oxide thickness at the front side of about 20 nm (on a total thickness of about 1460 nm). There is a good agreement between the measurement results for the non-trenched devices and for the trenched devices. This indicates that there is no detectable substrate recombination caused by the presence of deep trenches fabricated according to an embodiment of the disclosed method.

Figure 8:
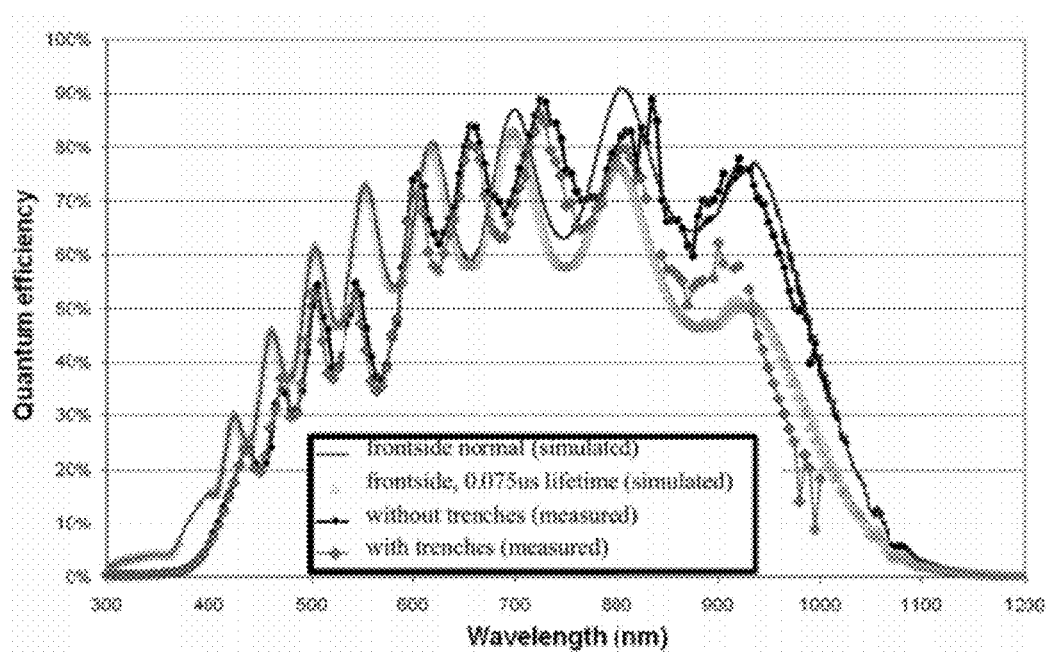
FIG. 8 shows measured and simulated quantum efficiency curves as a function of wavelength for non-trenched test diodes and for trenched test diodes fabricated according to a prior art method.

FIG. 8 shows the results of quantum efficiency measurements (performed using the same measurement set-up as for measurements shown in FIG. 7) for test diodes without trenches and for test diodes with trenches fabricated according to a prior art method. In addition, FIG. 8 shows matching simulations. While in the lower wavelength range the measured data sets are substantially the same for the trenched devices and for the non-trenched devices, towards the NIR (Near Infra Red) the response of the trenched device appears to be significantly lower than for non-trenched devices. These data therefore confirm that trenches fabricated according to prior art methods seem to reduce the minority carrier lifetime.

Although measurements are only shown for front side illuminated devices, the good agreement between measurements and simulations (FIG. 7 and FIG. 8) provide a good indication that in CMOS imagers fabricated according to embodiments of the disclosed method the minority carrier lifetime is not reduced due to the presence of trenches, as opposed to prior art CMOS imagers with trenches. Therefore, it is expected that the quantum efficiency of back side illuminated CMOS imagers fabricated according to a method of the present disclosure can be substantially better than for prior art back side illuminated CMOS imagers with trenches.

The low quantum efficiency, which limits the performance of prior art trenched CMOS imagers, was further investigated. The reduced fill factor due to the presence of the trenches accounts only for about 10% of the quantum efficiency loss. The lower quantum efficiency of the prior art trenched devices could be explained by assuming that recombination defects at the surface of the edges (sidewalls) of the trenches are trapping the charge carriers, thus deteriorating the pixel performance. The wavelength dependency of the diminished quantum efficiency also points into this direction (shorter wavelengths are more affected than the longer ones, as can be seen in FIG. 3). If the concentration of dopants and the potential barrier at the edges of the trenches is too low to repel the carriers from the surface then this increased surface recombination mechanism reduces the quantum efficiency of the device.

To verify this assumption, TSuprem CAD software was used to simulate the diffusion of dopants from the heavily doped polysilicon in the trenches into the silicon, in the case of the presence of a thin oxide layer or of trench residues at the edges. The results of these simulations are presented in FIGS. 4A-B. FIG. 4A shows a schematic cross section of a trench 30 filled with heavily doped polysilicon 32 and with a thin barrier layer 50 at the trench sidewall. FIG. 4B shows the simulated effect of the thickness of the barrier layer 50 on the dopant distribution profile in the silicon substrate 10, for different barrier layer thicknesses (0 nm, 1 nm, 2 nm and 5 nm).

This barrier layer can for example be a native oxide, e.g. with a thickness of 1 nm to 5 nm, if no proper in-situ cleaning has preceded the filling of the trenches. Using the same thermal annealing parameters as in the actual process flow, different thicknesses of oxide layers were simulated. As shown in FIG. 4B, the profile of the Boron concentration resulting from dopant diffusion from the highly doped polysilicon is highest and thus the potential barrier at the trench sidewall is highest in the case where no oxide is present. If the oxide has a thickness of 1 nm or more, the concentration of dopants in the silicon at the edge of the trenches is decreased by one, two, or four orders of magnitude.

The embodiments described provide measures to substantially reduce or avoid the barrier formation in the trenches during processing and thus ensure proper diffusion of dopants from the heavily doped polysilicon in the trenches into the surrounding silicon for fabricating imagers, and more particularly for fabricating imagers for back side illumination.

The invention claimed is:
1. A method comprising:
  forming at a front side of a substrate a plurality of high aspect ratio trenches having a predetermined trench depth;

forming at the front side of the substrate a plurality of photodiodes, wherein each photodiode is adjacent to at least one trench;

increasing quantum efficiency of an imager by forming an oxide layer on inner walls of each trench and removing the oxide layer;

filling each trench with a highly doped material; and thinning the substrate from a back side opposite the front side to a predetermined final substrate thickness.

2. The method of claim 1, wherein each trench has a depth at least ten times its width.

3. The method of claim 1, wherein the predetermined trench depth is greater than or equal to the predetermined final substrate thickness.

4. The method of claim 1, wherein the highly doped material comprises highly doped polysilicon.

5. The method of claim 1, further comprising:

forming at least one electrical contact at the front side.

6. The method of claim 1, further comprising:

forming a dielectric layer on the front side.

7. The method of claim 1, wherein forming each photodiode comprises:

forming a well at the front side; and forming the photodiode adjacent to the well.

8. The method of claim 7, wherein each well has a conductivity opposite a conductivity of the substrate.

9. The method of claim 1, wherein forming the oxide layer comprises forming the oxide layer using at least one of in-situ steam generated oxidation, wet oxidation, dry oxidation, and rapid thermal oxidation.

10. The method of claim 1, further comprising performing a chemical mechanical polish after filling each trench with the highly doped material.

11. A method comprising:

providing a substrate having a predetermined doping profile;

forming at a front side of the substrate a plurality of high aspect ratio trenches having a predetermined trench depth;

forming at the front side of the substrate a plurality of photodiodes, wherein each photodiode is adjacent to at least one trench;

increasing quantum efficiency of an imager by forming an oxide layer on inner walls of each trench and removing the oxide layer;

filling each trench with a highly doped material; and thinning the substrate from a back side opposite the front side to a predetermined final substrate thickness.

12. The method of claim 11, wherein the predetermined doping profile comprises a graded doping profile.

13. The method of claim 12, wherein the graded doping profile provides a built-in electric field suitable to guide the flow of photogenerated minority carriers towards the front side.

14. The method of claim 12, wherein the graded doping profile comprises one of a continuous slope doping profile and a staircase doping profile.

15. The method according to claim 11, wherein providing the substrate comprises:

providing a sacrificial substrate; and epitaxially growing a silicon layer with the predetermined doping profile on the sacrificial substrate to provide the graded doping profile.

16. The method of claim 11, wherein thinning the substrate comprises removing at least a portion of the sacrificial substrate.

17. A method of fabricating a plurality of complementary metal-oxide-semiconductor (CMOS) imagers for backside illumination, comprising:

forming at a front side of a substrate a plurality of high aspect ratio trenches having a predetermined trench depth;

forming at the front side of the substrate a plurality of photodiodes, wherein each photodiode is adjacent to at least one trench;

increasing quantum efficiency of the imagers by forming an oxide layer on inner walls of each trench and removing the oxide layer;

filling each trench with a highly doped material; and thinning the substrate from a back side opposite the front side to a predetermined final substrate thickness.

18. The method of claim 17, further comprising:

performing a surface treatment on the back side.

19. The method of claim 17, further comprising:

integrating the CMOS imagers with a readout integrated circuit.

20. The method of claim 17, wherein the substrate has a predetermined doping profile.

* * * * *